United States Patent [19]
Joy

[11] Patent Number: 6,046,909
[45] Date of Patent: Apr. 4, 2000

[54] COMPUTER CARD WITH A PRINTED CIRCUIT BOARD WITH VIAS PROVIDING STRENGTH TO THE PRINTED CIRCUIT BOARD

[75] Inventor: Stephen C. Joy, Portland, Oreg.

[73] Assignee: Intel Corporation, Santa Clara, Calif.

[21] Appl. No.: 09/192,793

[22] Filed: Nov. 16, 1998

[51] Int. Cl.[7] .................................................. H05K 1/18
[52] U.S. Cl. .......................... 361/748; 361/760; 361/764; 361/765; 361/767; 257/774; 257/773; 257/780; 257/782; 439/65; 439/66
[58] Field of Search .................................... 361/748, 760, 361/742, 794, 764, 765, 767; 257/774, 773, 779, 780, 782; 439/66, 65, 78

[56] References Cited

U.S. PATENT DOCUMENTS

| | | | |
|---|---|---|---|
| 5,173,055 | 12/1992 | Grabbe | 439/66 |
| 5,479,319 | 12/1995 | Werther | 361/784 |
| 5,764,485 | 6/1998 | Lebaschi | 361/774 |
| 5,847,936 | 12/1998 | Forehand et al. | 361/794 |
| 5,901,050 | 5/1999 | Imai | 361/820 |
| 5,906,042 | 5/1999 | Lan et al. | 29/852 |

*Primary Examiner*—Leo P. Picard
*Assistant Examiner*—David Foster
*Attorney, Agent, or Firm*—Blakely, Sokoloff, Taylor & Zafman LLP

[57] ABSTRACT

A card for a computer is described which has a printed circuit board having a substrate which includes a number of layers, and vias extending into the substrate. By configuring the vias correctly they can be used for distributing stresses on the printed circuit board which may result from a combined effect of a change in temperature and a mismatch between thermal coefficients of the printed circuit board and an electronic device mounted to the printed circuit board. The vias may be configured by providing more deep vias which extend through more layers of the substrate, by positioning the deeper vias correctly, and by controlling the dimensions of contact pads which are connected to the vias. By correctly configuring the vias, stresses on the printed circuit board can be reduced to and extent which would allow for a substrate having fewer layers and having larger surface areas.

22 Claims, 3 Drawing Sheets

COMPUTER CARD WITH A PRINTED CIRCUIT BOARD WITH VIAS PROVIDING STRENGTH TO THE PRINTED CIRCUIT BOARD

BACKGROUND OF THE INVENTION

1). Field of the Invention

The present invention relates to a printed circuit board and to a card incorporating a printed circuit board wherein vias of the printed circuit board provide strength to the printed circuit board.

2). Discussion of Related Art

A card for a computer usually includes a printed circuit board with one or more electronic devices mounted thereto. A printed circuit board may, for example, comprise a substrate with a number of contact pads formed thereon and electronic devices, such as semiconductor dies which are mounted to package substrates, may be mounted to the printed circuit board via an array of solder balls which are attached to the contact pads.

A substrate of a printed circuit board usually consists of a number of insulative layers with networks of metal lines sandwiched between the insulative layers. The vias extend from the contact pads through the layers and are connected to one another by the network of metal lines.

It may be required that a card for a computer be used in either high temperature or low temperature environments. The printed circuit board and the electronic devices of the card are usually made of different materials having different coefficients of thermal expansion. Because of the mismatch in coefficients of thermal expansion, the printed circuit board and the electronic devices tend to expand and contract at different rates when the card is subjected to high or low temperatures. Differences in expansion rates of the printed circuit board and the electronic devices, in turn, translate to a buildup of stresses on the printed circuit board. Stresses that are created on the printed circuit board may cause contact pads of the printed circuit board to tear out of a substrate of the printed circuit board, or cause delamination of layers of the substrate. Tearing out of contact pads is particularly problematic in cases where a layer of the substrate in which or on which the contact pads are formed is made of a softer material such as may be required for photolithographic purposes.

One solution which may prevent damage to printed circuit boards of the above kind would be to reduce the size or surface area of the printed circuit board and the electronic devices. A reduction in size of a printed circuit board and the electronic devices may, however, require an increase in the number of layers of a substrate of such a printed circuit board and a substrate of such an electronic device, to allow for more metal lines to be formed so that signals can be properly routed to and from the electronic devices. Cost implications may limit the number of layers of a substrate of a printed circuit board or an electronic device of the above kind.

SUMMARY OF THE INVENTION

A printed circuit board comprising a substrate which includes a plurality of layers located on one another, and a plurality of vias, over a first selected area of at least 25 mm² of the substrate, extending into the substrate. There is a first selection of at least 20 percent of the vias over the first selected area identifiable wherein each via of the first selection extends through at least half of the layers.

BRIEF DESCRIPTION OF THE DRAWINGS

The invention is further described by way of example with reference to the accompanying drawings wherein.

DETAILED DESCRIPTION OF THE INVENTION

Figure 1:
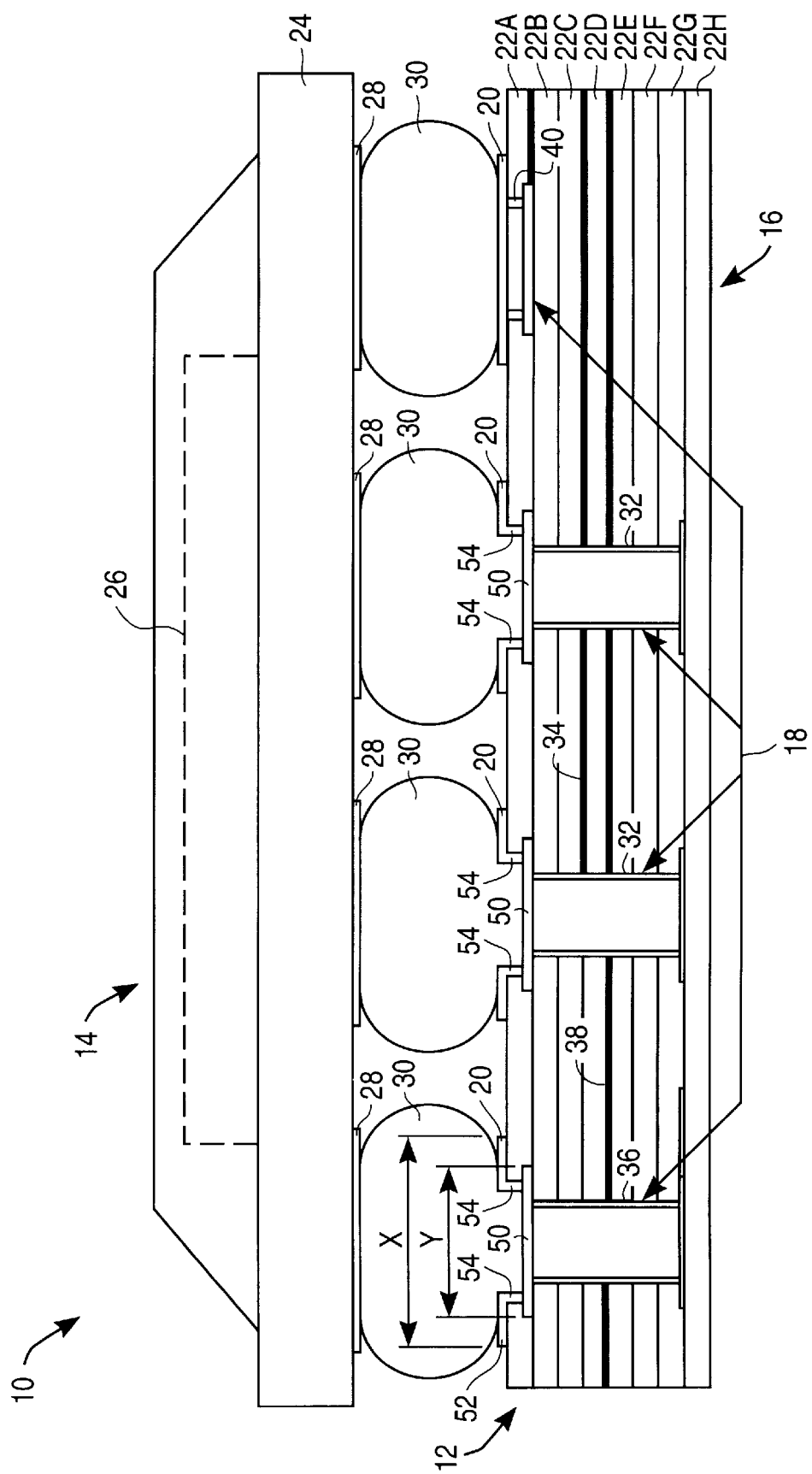
FIG. 1 is a partially sectioned side view illustrating a card for a computer according to the invention.

A card for a computer is described which has a printed circuit board having a substrate which includes a number of layers, and vias extending into the substrate. By configuring the vias correctly they can be used for distributing stresses on the printed circuit board which may result from a combined effect of a change in temperature and a mismatch between thermal coefficients of the printed circuit board and an electronic device mounted to the printed circuit board. The vias may be configured by providing more deep vias which extend through more layers of the substrate, by positioning the deeper vias correctly, and by controlling the dimensions of contact pads which are connected to the vias. By correctly configuring the vias, stresses on the printed circuit board can be reduced to an extent which would allow for a substrate having fewer layers and having larger surface areas.

General aspects of the invention are now briefly discussed with the assistance of FIG. 1 and FIG. 1A, whereafter an embodiment of the invention is described with reference to FIGS. 1, 2 and 3 wherein like reference numerals indicate like or similar components.

FIG. 1 of the accompanying drawings illustrates a card 10 for a computer comprising a printed circuit board 12 and one or more electronic devices 14 mounted to the printed circuit board 12. The printed circuit board 12 includes a substrate 16 and a plurality of vias 18 formed in holes in the substrate 16 and extending into the substrate 16. Contact pads 20 are formed on a surface of the substrate 16, each contact pad being in contact with a respective via 18. The substrate 16 includes a number of insulative layers 22 which are laminated on one another.

The electronic device may be a semiconductor package comprising a package substrate 24 and a semiconductor die 26 mounted to the package substrate 24. Bond pads 28 are located on a side of the package substrate 24 opposing the semiconductor die 26. A respective solder ball 30 is attached to a respective bond pad 28. The electronic device 14 is located on the printed circuit board 12 with each solder ball 30 contacting a respective contact pad 20 and the card 10 is then sent through a furnace which causes reflow of the solder balls 30 and attachment of each solder ball 30 to a respective contact pad 20.

The vias 18 can be divided into a first selection and a second selection. The vias of the first selection extend through most of the insulative layers 22, typically through at least half of the insulative layers 22, and include circuit vias 32 which are connected to one another by a network of metal lines 34 which are sandwiched between the insulative layers 22, and a number of additional vias 36 which may or may not be connected to other vias. The circuit vias 32 are utilized for routing of electronic signals to and from the electronic device 14. The additional vias 36 provide structural integrity to the printed circuit board 12. All the vias 32 and 36 of the first selection may be connected to a power bus layer 38 which may be sandwiched between the insulative layers 22. The vias of the second selection include vias 40 extending through only a few of the insulative layers 22. Solitary bond pads (not shown) may also be provided on a surface of the substrate 16. The solitary bond pads may not be connected to any vias but may be connected to one another by metal lines on the surface of the substrate 16.

The card 10 may, in use, be subjected to alternating high and low temperatures. The electronic device 14 may have a coefficient of thermal expansion which differs from a coefficient of thermal expansion of the printed circuit board 12 so that the electronic device 14 and the printed circuit board 12 expand and contract at different rates when the card 10 is heated or cooled. Stresses may be created on the printed circuit board 12 because of differences in expansion or contraction rates of the printed circuit board 12 and the electronic device 14, which may tend to cause delamination of the insulative layers 22 or for the contact pads 20 to be torn out of the substrate 16. Tearing out of the contact pads 20 may be of particular concern when a first layer 22A of the insulative layers 22, in which the contact pads 20 are located, is made of a softer material than the other insulative layers 22B–22H, as may be required for purposes of photolithographically forming openings in the first insulative layer 22A.

One solution for reducing damage to the printed circuit board 12 is to reduce the surface area, or size of the printed circuit board 12 and the surface area, or size of the package substrate 24. A reduction in size of the printed circuit board 12 or the package substrate 24 may, in turn, necessitate more of the insulative layers 22 so that more metal lines 34 may be provided for routing of electronic signals. An increase in the number of insulative layers 22 may however be very costly.

A less costly alternative is to increase the size of the first selection of vias 32 and 36 by increasing the number of additional vias 36 which then provide structural integrity to the printed circuit board 12. In order to effectively prevent damage to the printed circuit board 12, an increase in the size of the first selection of the vias 32 and 36 may have to go hand in glove with strategic location of the additional vias 36 so that the density of the first selection of vias 32 and 36 may be higher in certain pre-identified high stress areas of the printed circuit board 12, or so as to ensure strengthening of the printed circuit board 12 in certain pre-identified high stress areas. Also of importance are the dimensions and configurations of the vias 32 and 36 and the contact pads 20.

Ideally, the printed circuit board 12 should have fewer than twelve, more preferably fewer than ten of the insulative layers 22 and should be capable of withstanding 1000 temperature cycles between −40° C. and 85° C. without delamination of the insulative layers 22 or other damage to the printed circuit board 12.

Figure 2:
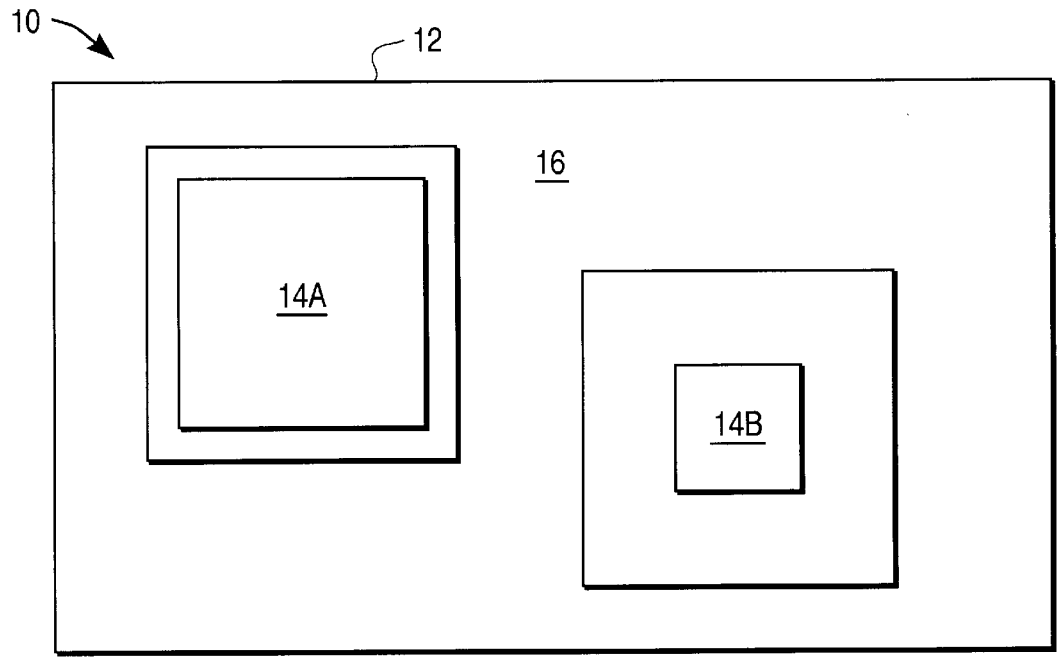
FIG. 2 is a top plan view of a card for a computer according to the invention.

FIG. 2 illustrates a card 10 for a computer comprising a printed circuit board 12 and two electronic devices 14A and 14B mounted to the printed circuit board 12. Referring to FIG. 3, each respective electronic device 14A or 14B is mounted, as hereinbefore described with reference to FIG. 1, to contact pads (not shown) which are connected to vias located over first and second respective selected areas 42 and 44 of a substrate 16 of the printed circuit board 12. The first and second areas 42 and 44 may be spaced from one another by a distance D of about 8 mm.

The substrate 16 may have a length L of about 90 mm and a width W of about 57 mm aid therefore a total surface area of about 5130 mm². The first area 42 may have a length L1 of about 31 mm and a width W1 of about 31 mm and therefore a total surface area of about 961 mm². The vias of the first area 42 may be located in a square array of 26 rows and 26 columns, thus totaling 676 vias. The second area 44 may have a length L2 of about 35 mm and a width W2 of about 35 mm and therefore a total surface area of about 1225 mm². The vias of the second area 44 may be located in a square array of 27 rows and 27 columns, thus totaling 729 vias. The invention generally finds application for a printed circuit board with an area having vias formed therein wherein the area is at least 600 mm², more preferably at least 900 mm², wherein the substrate has a surface area of at least 1500 mm², or wherein the printed circuit board has at least 600 vias.

About 15 percent of the vias of each area 42 or 44 may consist of circuit vias 32 (indicated by a small circle within a larger circle) and about 15 percent, more preferably about 20 percent, of the vias of each area 42 or 44 may consist of additional vias 36 (indicated by a darkened circle within a larger circle). A respective first selection of the vias within each area 42 or 44 thus consists of the circuit vias 32 and the additional vias 36 which, in combination, comprise about 30 percent, more preferably about 35 percent, of the vias within the respective area 42 or 44. The invention generally finds application where the vias of the first selection comprise at least 20 percent of the total number of vias, although the invention may also find application where a larger number of the vias, for example at least 45 percent of the vias comprise of additional vias and at least 50 percent of the vias comprise of circuit vias and additional vias. In order to still ensure space for routing of metal lines, the additional vias and the circuit vias preferably comprise less than 60 percent, more preferably less than 40 percent of the total number of vias within a respective area.

All of the other vias 40 and the positioning of solitary bond pads are indicated by larger single circles.

Figure 3:
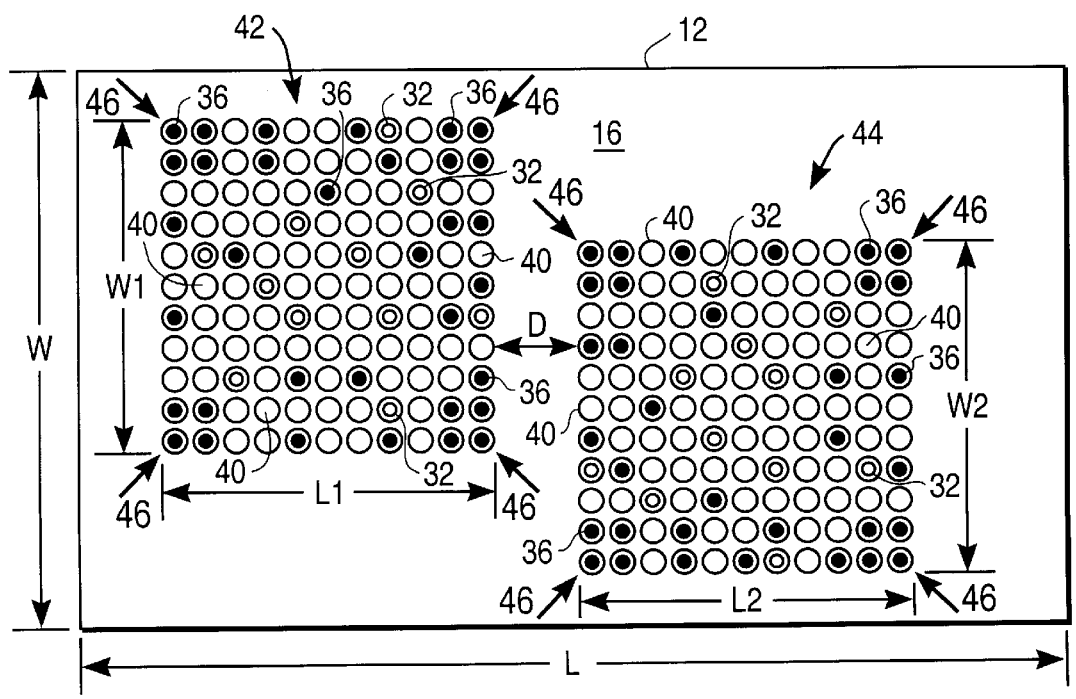
FIG. 3 is a top plan view of a printed circuit board forming part of the card shown in FIG. 2.

Although the areas 42 and 44 jointly include all the vias illustrated in FIG. 3, it should be understood that the invention may also find application where a smaller area can be identified within a group of vias. Such a smaller area may, as with the areas 42 and 44, be rectangular or square. However, when an area is selected to be too small, the area may lose its representative nature of the vias in the vicinity of the area. If a smaller area is identified, such a smaller area should therefore have a minimum size of, for example, at least 25 mm², more preferably at least 100 mm².

Ideally, every fourth, fifth or sixth via in every row or column should form part of the first selection of vias, i.e. every fourth, fifth or sixth via in every row or column should either be a circuit via 32 for an additional via 36. The first selection of vias is preferably more densely grouped near a periphery of the respective area 42 or 44 where stresses can be expected to be higher. Furthermore, at least one, more preferably two, three or four of the vias in each of four corners 46 of each respective area 42 or 44 should be either a circuit via 32 or an additional via a 36, thus forming part of the first selection of vias.

Referring again to FIG. 1 more specifically, the substrate 16 may have a total of eight of the insulative layers 22, the circuit vias 32 and the additional vias 36 may extend-through the substrate 16 from and including the second layer 22B to and including the seventh layer 22G. The other vias 40 may extend only through a first layer 22A, and maybe also the second layer 22B and a third layer 22C of the insulative layers 22. As mentioned previously, solitary bond pads (not shown) may also be provided.

The layers 22A–H may be epoxy based materials such as epoxy acrylates sold by Ibiden Co., Ltd. of Nagoya, Japan. The overall coefficient of thermal expansion of the substrate 16 is typically between about 10 and about 15 parts per million per degree Celsius (ppm/° C.) and the coefficient of thermal expansion of each electronic device 14A or 14B is typically between about 5 and about 10 ppm/° C. higher than that of the substrate 16.

Each contact pad 20 connected to each circuit via 32 or additional via 36 may include a contact portion 50 located on a second layer 22B of the insulative layers 22, and a toroid 52 located on a first layer 22A of the insulative layers 22. The toroid 52 may surround the contact portion 50 and be connected to the contact portion 5G by a hollow blind via 54. The toroid 52 preferably has a diameter X which is larger than a diameter Y of the contact portion 50. In one example the diameter X of the toroid 52 is about 0.60 mm and the diameter Y of the contact portion 50 is about 0.41 mm.

It has been found that a card 10 as specifically described with reference to FIGS. 1 to 3 is capable of withstanding 1000 temperature cycles between −40° C. and 85° C. without delamination of the insulative layers 22 or other damage to the printed circuit board 12.

While certain exemplary embodiments have been described and shown in the accompanying drawings, it is to be understood that such embodiments are merely illustrative and not restrictive of the current invention, and that this invention is not restricted to the specific constructions and arrangements shown and described, since modifications may occur to those ordinarily skilled in the art.

What is claimed:

1. A printed circuit board comprising:
   a substrate which includes a plurality of layers located on one another; and
   a plurality of vias, over a first selected area of at least 25 mm$^2$ of the substrate, extending into the substrate, there being a first selection of at least 20 percent of the vias over the first selected area, each via of the first selection over the first selected area extending through a selected number of layers being at least half of the layers, and a second selection of at least 20 percent of the vias over the first selected area, each via of the second selection over the first selected area extending through fewer of the layers than the selected number of layers.

2. The printed circuit board of claim 1 wherein the first selected area is at least 900 mm$^2$.

3. The printed circuit board of claim 1 comprising at least 600 vias over the first selected area.

4. The printed circuit board of claim 1 wherein the vias of the first selection are more densely grouped near a periphery of the first selected area.

5. The printed circuit board of claim 1 wherein the first selected area has four corners and at least one via of the first selection is located at each of the four corners.

6. The printed circuit board of claim 5 wherein at least four vias of the first selection are located at at least one of the four corners.

7. The printed circuit board of claim 1 wherein the substrate has fewer than 12 layers.

8. The printed circuit board of claim 1 further comprising contact pads at a surface of the substrate, each contact pad being connected to a respective via.

9. The printed circuit board of claim 8 wherein one of the layers, at the surface, is softer than at least some of the other layers.

10. The printed circuit board of claim 8 wherein each contact pad comprises a contact portion connected to a respective via, and a toroid located on a side of the contact portion opposing via, the toroid having a diameter which is larger than a diameter of the contact portion.

11. The printed circuit board of claim 1 wherein from every fourth to every sixth of the vias in a row of the vias forms part of the first selection.

12. The printed circuit board of claim 1 further comprising:
    a plurality of vias over a second selected area of the substrate, the second selected area being spaced from the first selected area, the vias of the second selected area extending into the substrate, there being a first selection of at least 20 percent of the vias over the second selected area, each via of the first selection over the second selected area extending through at least half of the layers.

13. A printed circuit board comprising:
    a substrate which includes a plurality of layers located on one another; and
    a plurality of vias over a first selected area of the substrate, the vias over the first selected area extending into the substrate, there being a first selection of the vias over the first selected area which are more densely grouped near a periphery of the first selected area, and each via of the first selection over the first selected area extending through a selected number which is at least half of the layers, and a second selection of vias over the first selected area which extend into fewer of the layers than the selected number of layers.

14. A card comprising:
    a printed circuit board comprising:
        a substrate which includes a plurality of layers located on one another; and
        a plurality of vias over a first selected area of at least 25 mm$^2$ of the substrate, the vias over the first selected area extending into the substrate, there being a first selection of at least 20 percent of the vias over the first selected area, each via of the first selection over the first selected area extending through a selected number which is at least half of the layers, and a second selection of vias over the first selected area which extend into fewer of the layers than the selected number of layers; and
    a first electronic device mounted to the printed circuit board over the first selected area.

15. The card of claim 14 wherein the printed circuit board further comprises a plurality of vias over a second selected area of the substrate, the vias of the second selected area extending into the substrate there being a first selection of at least 20 percent of the vias over the second selected area, each via of the first selection over the second selected area extending through at least half of the layers, the card further comprising a second electronic device mounted to the substrate over the second selected area.

16. The card of claim 14 wherein the substrate has a surface area of at least 1500 mm$^2$.

17. A card comprising:
    a printed circuit board comprising:
        a substrate having a surface area of at least 900 mm$^2$ and including a plurality of layers on one another;
        a plurality of vias over a first selected area of the substrate, the vias over the first selected area extending into the substrate; and
    an electronic device mounted to the substrate over the first selected area, there being a first selection of the vias over the first selected area, each via of the first selection over the first selected area extending through a selected number which is at least half of the layers, and a second selection of vias over the first selected area which extend into fewer of the layers then the selected number of layers, the first selection of the vias over the first selected area being large enough and positioned so that the printed circuit board and the electronic device can withstand 1000 temperature cycles between −40° and 85° C. without substantial damage to the printed circuit board.

18. A printed circuit board comprising:

a substrate which includes a plurality of layers located on one another; and a plurality of vias, over a first selected area of at least 900 mm$^2$ of the substrate, extending into the substrate, there being a first selection of at least 20 percent of the vias over the first selected area, each via of the first selection over the first selected area extending through at least half of the layers.

19. A printed circuit board comprising:

a substrate which includes a plurality of layers located on one another; and a plurality of at least 600 vias, over a first selected area of at least 25 mm$^2$ of the substrate, extending into the substrate, there being a first selection of at least 20 percent of the vias over the first selected area, each via of the first selection over the first selected area extending through at least half of the layers.

20. A printed circuit board comprising:

a substrate which includes a plurality of layers located on one another, at least one of the layers, at the surface, being softer than at least some of the other layers; and a plurality of vias, over a first selected area of at least 25 mm$^2$ of the substrate, extending into the substrate, there being a first selection of at least 20 percent of the vias over the first selected area, each via of the first selection over the first selected area extending through at least half of the layers.

21. A printed circuit board comprising:

a substrate which includes a plurality of layers located on one another; and a plurality of vias, over a first selected area of at least 25 mm$^2$ of the substrate, extending into the substrate, there being a first selection of at least 20 percent of the vias over the first selected area, from every fourth to every sixth of the vias in a row of the vias forming part of the first selection, each via of the first selection over the first selected area extending through at least half of the layers.

22. A printed circuit board comprising:

a substrate which includes a plurality of layers located on one another;

a plurality of vias, over a first selected area of at least 25 mm$^2$ of the substrate, extending into the substrate, there being a first selection of at least 20 percent of the vias over the first selected area, each via of the first selection over the first selected area extending through at least half of the layers; and a plurality of vias over a second selected area of the substrate, the second selected area being spaced from the first selected area, the vias of the second selected area extending into the substrate, there being a first selection of at least 20 percent of the vias over the second selected area, each via of the first selection over the second selected area extending through at least half of the layers.

* * * * *

UNITED STATES PATENT AND TRADEMARK OFFICE
CERTIFICATE OF CORRECTION

PATENT NO. : 6,046,909
DATED : April 4, 2000
INVENTOR(S) : Joy

Figure 1A:
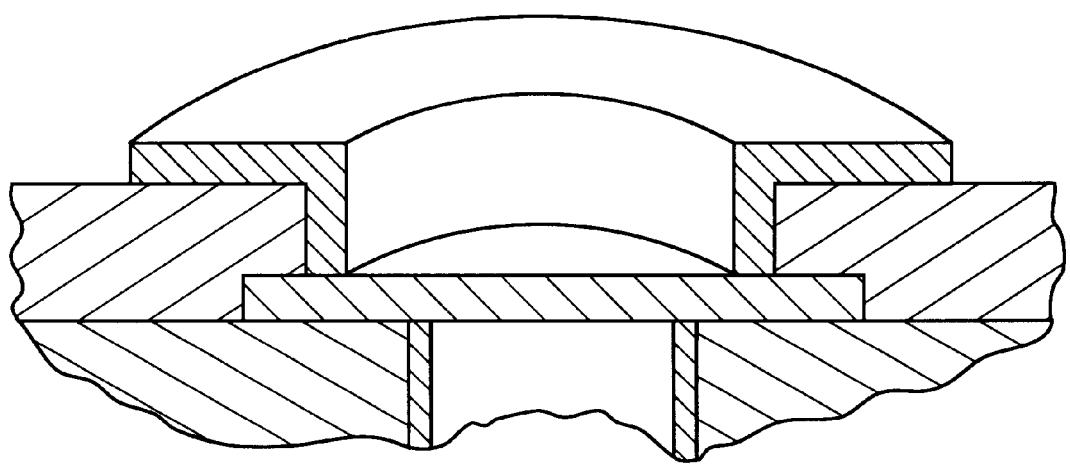

It is certified that error appears in the above-identified patent and that said Letters Patent is hereby corrected as shown below:

In column 2, at line 7, insert "Figure 1A is an enlarged view of a portion of the card--.

In column 3, at line 67, remove "aid" and insert -- and --.

Signed and Sealed this

Fifteenth Day of May, 2001

*Attest:*

NICHOLAS P. GODICI

*Attesting Officer*   Acting Director of the United States Patent and Trademark Office